United States Patent
Haugen

(10) Patent No.: US 12,542,516 B2
(45) Date of Patent: Feb. 3, 2026

(54) CRYSTAL OSCILLATOR ENERGY INJECTION

(71) Applicant: Silicon Laboratories Inc., Austin, TX (US)

(72) Inventor: Håkon Haugen, Sandvika (NO)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 18/631,439

(22) Filed: Apr. 10, 2024

(65) Prior Publication Data

US 2025/0323600 A1    Oct. 16, 2025

(51) Int. Cl.
*H03B 5/32*     (2006.01)
*H03K 3/0231*   (2006.01)
*H03L 5/00*     (2006.01)

(52) U.S. Cl.
CPC .......... *H03B 5/32* (2013.01); *H03K 3/02315* (2013.01); *H03L 5/00* (2013.01); *H03B 2200/0012* (2013.01); *H03B 2200/005* (2013.01); *H03B 2200/0052* (2013.01); *H03B 2200/0082* (2013.01)

(58) Field of Classification Search
CPC .............. H03B 5/30; H03B 5/32; H03B 5/36; H03B 5/362; H03B 5/364; H03B 5/366; H03B 5/368; H03B 2200/0052; H03B 2200/0082; H03K 3/012; H03K 3/015; H03L 5/00; H03L 5/02
See application file for complete search history.

(56) References Cited

U.S. PATENT DOCUMENTS

| | | | | |
|---|---|---|---|---|
| 5,113,156 A * | 5/1992 | Mahabadi | ............... | H03B 5/364 331/109 |
| 2005/0017812 A1* | 1/2005 | Ashida | ................. | H03K 3/0307 331/158 |
| 2005/0174183 A1* | 8/2005 | Tachibana | .............. | H03B 5/364 331/158 |
| 2007/0024385 A1* | 2/2007 | Greenberg | ................ | H03L 5/00 331/158 |
| 2009/0096541 A1* | 4/2009 | Tran | ......................... | H03B 5/06 331/116 R |

(Continued)

OTHER PUBLICATIONS

Xu, L., et al., "A 510-pW 32-kHz Crystal Oscillator With High Energy-to-Noise-Ratio Pulse Injection," IEEE Journal of Solid-State Circuits, vol. 57, No. 2, Feb. 2022, pp. 434-451.

*Primary Examiner* — Levi Gannon
(74) *Attorney, Agent, or Firm* — Zagorin Cave LLP

(57) ABSTRACT

A crystal oscillator includes a current source that charges a capacitor. A charge on the capacitor is periodically injected into a crystal of the crystal oscillator. A switch couples the capacitor to the crystal and a timing circuit controls the switch to cause the charge to be injected beginning at approximately a peak of a crystal output signal. The timing circuit is configurable into a self-resonant mode for calibration of a delay through the timing circuit by coupling an output of the timing circuit to an input of the timing circuit. A comparator compares a magnitude of the crystal output signal to a reference voltage and supplies compare results to a gain control circuit. The gain control circuit adjusts the current from the current source to adjust the charge being injected into the crystal from the capacitor to thereby control the magnitude of the crystal output signal.

20 Claims, 5 Drawing Sheets

(56) References Cited

U.S. PATENT DOCUMENTS

| | | | |
|---|---|---|---|
| 2010/0321123 A1* | 12/2010 | Casagrande | H03B 5/364 |
| | | | 331/116 FE |
| 2016/0099682 A1* | 4/2016 | Liu | H03B 5/364 |
| | | | 331/116 FE |
| 2016/0373056 A1* | 12/2016 | Kumar | H03B 5/06 |
| 2019/0006991 A1* | 1/2019 | Marques | H03B 5/366 |
| 2019/0007005 A1* | 1/2019 | Marques | H03B 5/364 |
| 2019/0007012 A1* | 1/2019 | Marques | H03B 5/364 |
| 2020/0235702 A1* | 7/2020 | Kumar | H03B 5/06 |
| 2022/0360221 A1* | 11/2022 | Garvik | H03B 5/32 |

\* cited by examiner

CRYSTAL OSCILLATOR ENERGY INJECTION

BACKGROUND

Field of the Invention

This application relates to crystal oscillators and more particularly to low power crystal oscillators.

Description of the Related Art

Crystal oscillators (XOs) are commonly implemented as Pierce oscillators for their simplicity and the ease of tuning. FIG. 1 illustrates a basic Pierce oscillator 100 and the corresponding crystal model 101. The crystal oscillator 100 includes a crystal 102 and tuning capacitors $C_{L1}$ 104 and $C_{L2}$ 106 used to tune the frequency of the crystal oscillator 100. The crystal has two terminals labeled XI and XO with one terminal 105 (node XI) connected to the input for the amplifier 108 and the other terminal 107 (node XO) connected to the output of the amplifier. The amplifier can take various forms. One popular and simple amplifier implementation uses a simple CMOS inverter and the resistor 110 (RF) biases the amplifier at the threshold voltage of the inverter to get maximum gain.

In a Pierce oscillator, the oscillation happens at the parallel resonance of the crystal which can be determined by:

$$f_0 = f_S \sqrt{1 + \frac{C_S}{C_T}} = \frac{1}{2\pi} \sqrt{\frac{1}{L_S C_S}} \sqrt{1 + \frac{C_S}{C_T}}$$

where $f_S$ is the series resonant frequency and along with $L_S$ and $C_S$ are determined by the crystal. Cs represents the motional capacitance. It represents the piezoelectric charge gained from a displacement in the crystal. $R_S$ represents the motional resistance and represents the mechanical losses in the crystal. $L_S$ represents the motional inductance and represents the moving mass in the crystal. $C_0$ is the shunt capacitance between the electrodes XI and XO and stray capacitance, $C_L$ is the load capacitance, and $$C_T = C_0 + C_L = C_0 + \frac{C_{L1} C_{L2}}{C_{L1} + C_{L2}}.$$

One issue with the structure shown in FIG. 1 is that the amplifier 108 is continually driven resulting in a significant amount of power being consumed by the amplifier. One power saving solution injects pulses into the crystal to maintain oscillation rather than continually driving the amplifier. Improvements in pulse injection solutions that reduce complexity and still provide low power consumption are desirable.

SUMMARY OF EMBODIMENTS OF THE INVENTION

Accordingly, in an embodiment an apparatus includes a current source to supply a current. A capacitor is coupled to be charged by the current. A first switch couples the capacitor to a crystal and periodically injects a charge from the capacitor into the crystal.

In another embodiment, a method includes supplying current from a current source to charge a capacitor and periodically injecting a charge from the capacitor into a crystal in a crystal oscillator.

In another embodiment a crystal oscillator includes a current source to supply a current. A capacitor is coupled to be charged by the current and is coupled to periodically inject a charge from the capacitor into a crystal of the crystal oscillator. A first switch couples the capacitor to the crystal. A timing circuit controls the first switch to cause the charge to be injected beginning at approximately a peak of a crystal output signal. The timing circuit is configurable into a self-resonant mode by coupling an output of the timing circuit to an input of the timing circuit. A comparator circuit compares a magnitude of an output signal of the crystal oscillator to a reference voltage and supplies compare results. A gain control circuit is coupled to the comparator circuit to control the current source to adjust the current being used to charge the capacitor to thereby adjust the charge being injected by the capacitor into the crystal based on the compare results and thereby control the magnitude of the output signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
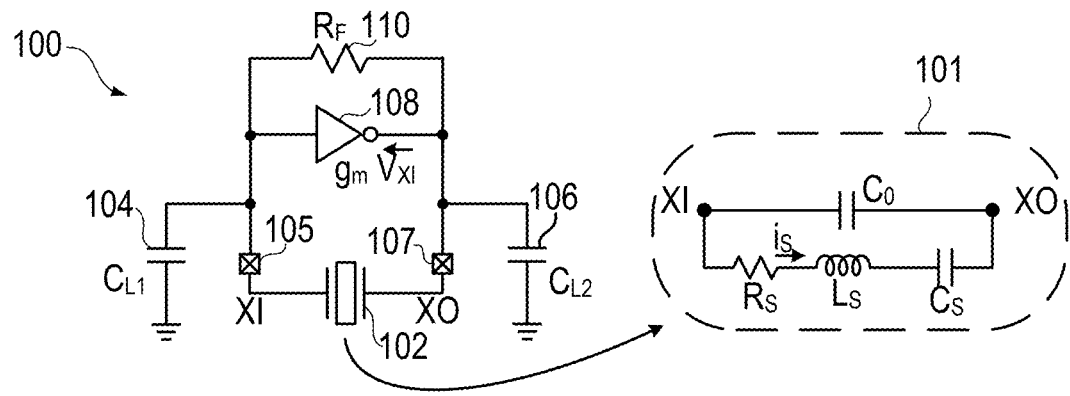
FIG. 1 illustrates a Pierce oscillator and the corresponding crystal model.
Figure 2:
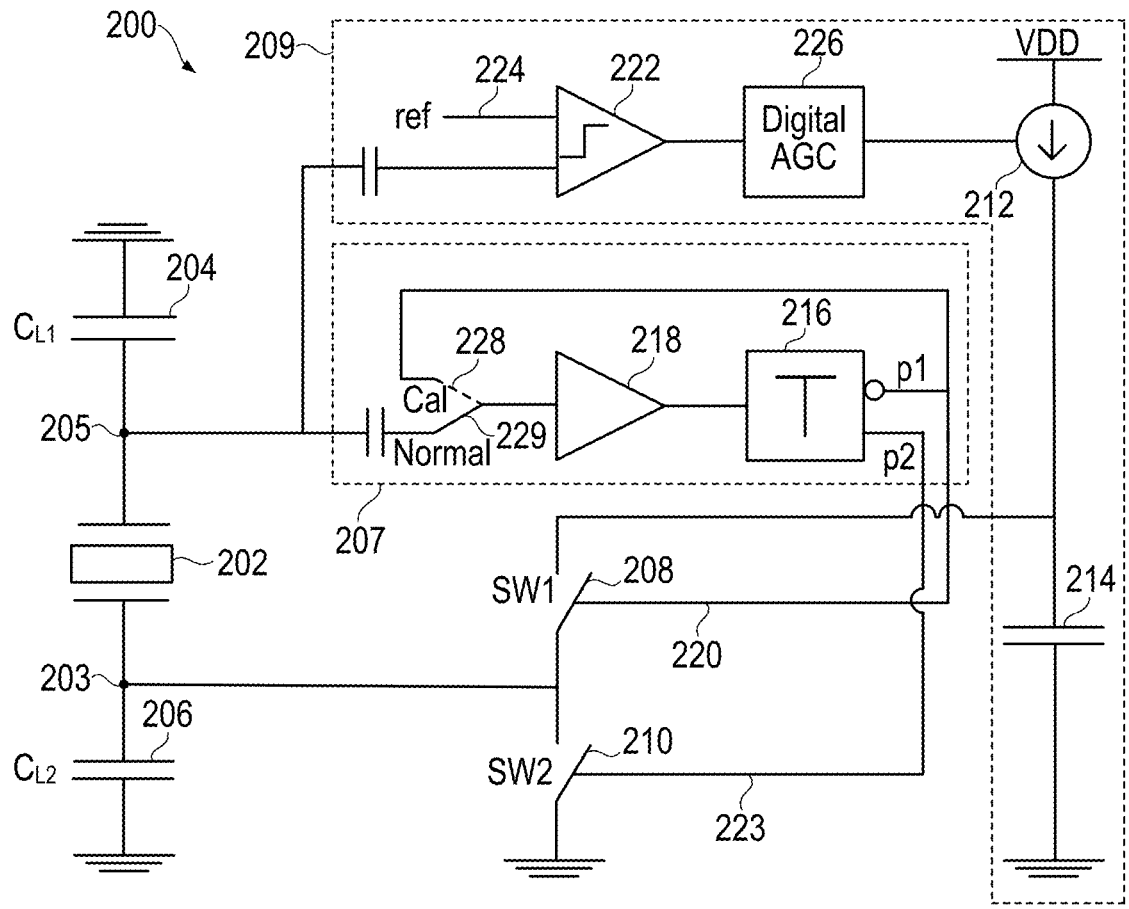
FIG. 2 illustrates an embodiment of a low-power crystal oscillator.

FIG. 2 illustrates an embodiment of a low power crystal oscillator (XO) 200. The crystal oscillator 200 includes the crystal 202, load capacitors 204 and 206. Rather than having a linear inverting amplifier providing energy to the crystal as shown, e.g., in FIG. 1, switches SW1 208 and SW2 210 provide pulses of energy to the crystal through node 203. One challenge of using pulse injection is accurately timing the pulses so they occur at the peaks and troughs of the sine wave generated by the crystal. The timing portion of the crystal oscillator is shown as the circuits in timing block 207. Another challenge is controlling the magnitude of the crystal oscillator output while still maintaining low power consumption. The magnitude of the crystal output is controlled using the circuits in magnitude control block 209. Both the timing block 207 and the magnitude control block 209 are discussed further herein.

The current source 212 charges the storage capacitor 214. The charge stored in capacitor 214 is periodically injected into the crystal through the switch SW1 208. For maximum efficiency, the charge is injected at approximately the peak of the sine wave present at node 203 of the crystal. To achieve correct timing of energy injection into the crystal the timing block 207 includes a delay circuit 216 (T) used to create a delay of approximately 90°. In an embodiment, the delay circuit uses an RC delay after the clock input stage. Additional details of an embodiment of delay circuit 216 are described further herein. The AC-coupled squaring buffer 218 receives a sine wave from node 205 of the crystal and supplies a clock signal output that has rising (and falling) edges at approximately the zero crossing of the sine wave. Delaying the output signal of the squaring buffer 90° from the zero crossing results in a signal that corresponds approximately to the peak of the sine wave. That delay is used to generate a switch signal 220 to close switch SW1 208 at the peak of the sine wave at node 203. The inverse 223 of switch signal 220 is used to couple node 203 to ground through switch SW2 210 at the negative peak (trough) of the sine wave to deplete charge at node 203. In an embodiment, charge is injected every cycle of the crystal oscillator.

In addition to timing the pulse injections, the embodiment shown in FIG. 2 also controls the amplitude of the crystal output by sensing the magnitude and controlling the current source 212 and thus the charge injected into the crystal from capacitor 214. The comparator circuit 222 compares output from node 205 to the reference voltage (Ref) 224. In the illustrated embodiment a digital automatic gain control (AGC) circuit 226 receives the comparator output and based on the comparator output determines whether the magnitude of the crystal oscillator output requires that the charge being injected into the crystal be adjusted higher, lower, or left alone. If the injected charge needs to be reduced, the AGC circuit reduces the current being supplied by current source 212 in a manner that is well known in the art. For example, the current source may be formed of a number of transistors, which are controlled by the digital AGC and the number of transistors turned on is reduced to reduce the current. If the injected charge needs to be increased, the AGC circuit increases the number of transistors turned on.

Figure 3:
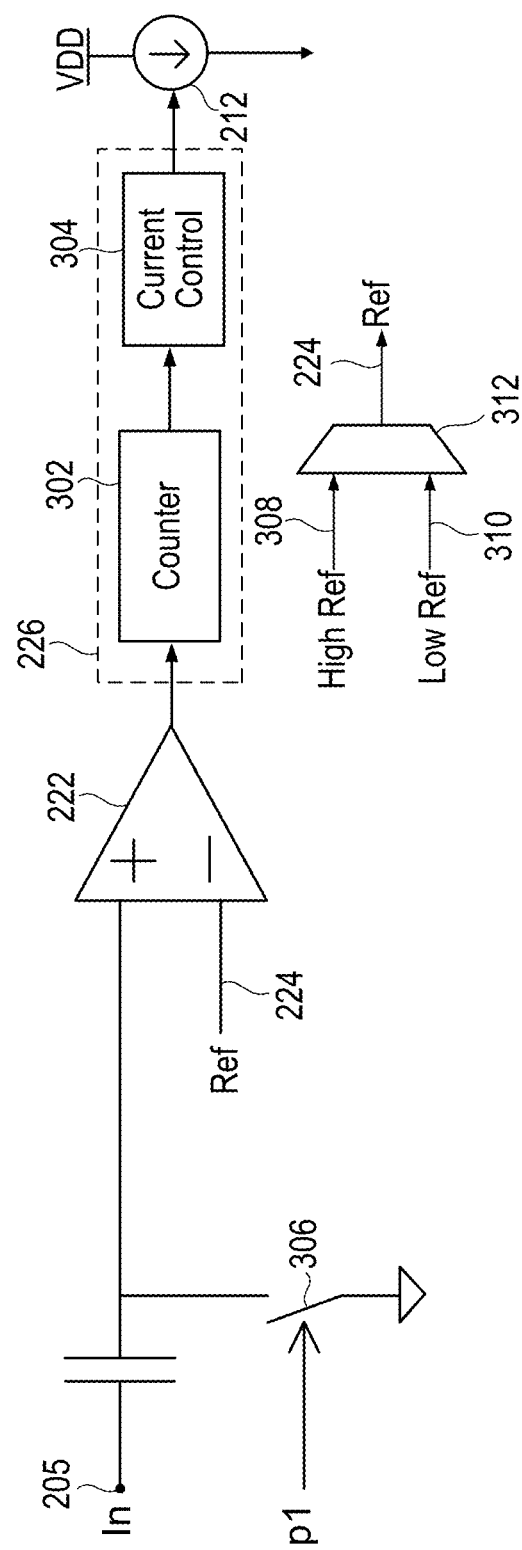
FIG. 3 illustrates an embodiment of the magnitude check circuit with an automatic gain control (AGC) circuit.

FIG. 3 illustrates an embodiment of the magnitude check circuit with a digital AGC, which is implemented as a counter 302 and control logic 304 to control the current source 212. The switch 306 closes in response to a clock signal p1 that is synchronous with the sine wave trough and is open as the sine wave reaches its peak grounding the positive input of the comparator and thereby establishing a reference point at ground for the comparator. The comparator asserts the comparator output when the magnitude of the sine wave from the crystal is greater than the reference voltage. In an embodiment two reference voltages are used to ensure that the current is maintained at a desired level. The first reference voltage (high reference) 308 checks if the magnitude of the crystal output is too high indicating that the current being supplied to the storage capacitor is too high, which wastes power. If the magnitude of the crystal output is too high, the crystal output will be higher than the reference voltage. The second reference voltage (low reference) 310 checks if the magnitude of the crystal output is too low indicating that the current supplied to the storage capacitor is not high enough. If magnitude of the crystal output is too low, the crystal output will be lower than the reference voltage. The selector circuit 312 selects whether to supply the high reference voltage or the low reference voltage. When the crystal output is above the reference voltage the comparator output asserts causing the counter 302 to count. The control logic 304 uses the counter value after a predetermined number of oscillator cycles to determine if the magnitude of the oscillator output is satisfactory. For example, assume that for 8 cycles (sequential or otherwise) the selector circuit 312 supplies the low reference voltage and for 8 cycles the selector circuit supplies the high reference voltage. If the magnitude of the crystal output is exactly where desired for the 16 cycles, the counter will have a count value of 8 reflecting the crystal output was never above the high reference voltage and always above the low reference voltage. A count value of 16 indicates the magnitude of the crystal output is always above the reference voltage requiring the current being supplied to the storage capacitor 214 to be reduced. A count value of 0 indicates the magnitude of the crystal was always below the high and low reference voltages, which indicates the current supplied to the storage capacitor 214 needs to be increased. Of course, other thresholds besides 16 and 0 can be used by the control logic 304. For example, a count value of 4 or below may be used as the threshold to indicate that the current charging the capacitor needs to be increased to increase the charge being injected into the crystal and a count value of 12 or above to indicate that the current charging the capacitor should be reduced to reduce the injected charge. Note that utilizing 16 oscillator cycles is by way of example and other number of cycles are used in other embodiments. In still other embodiments, the current supplied to charge the capacitor 214 is reduced whenever the oscillator output goes above the high reference and is reduced whenever the oscillator output goes below the low reference. That approach can lead to simpler control but more frequent current changes.

In order to save additional power, in an embodiment the crystal magnitude is checked only periodically by the digital AGC 226. Between checks the amplitude checking circuit enters a sleep mode in which the comparator 222 is powered off. Most of the remaining logic associated with checking the crystal magnitude is static and thus consumes no power. During the sleep state a "sleep-counter" is running and timing when to wake. On waking, the comparator turns on and the amplitude check is made and the AGC adjusts the current being supplied by the current source 212 as needed. In an embodiment, the magnitude is checked for a number of cycles, e.g., 16 cycles and then the comparator sleeps for a length of time, e.g., ms or seconds. In embodiments, the number of oscillator cycles checked and the length of time in low power mode with the comparator being turned off are programmable. The sleep length is determined by the sleep-counter (not shown) that is clocked by an output of the crystal oscillator or a derivative thereof.

Figure 4:
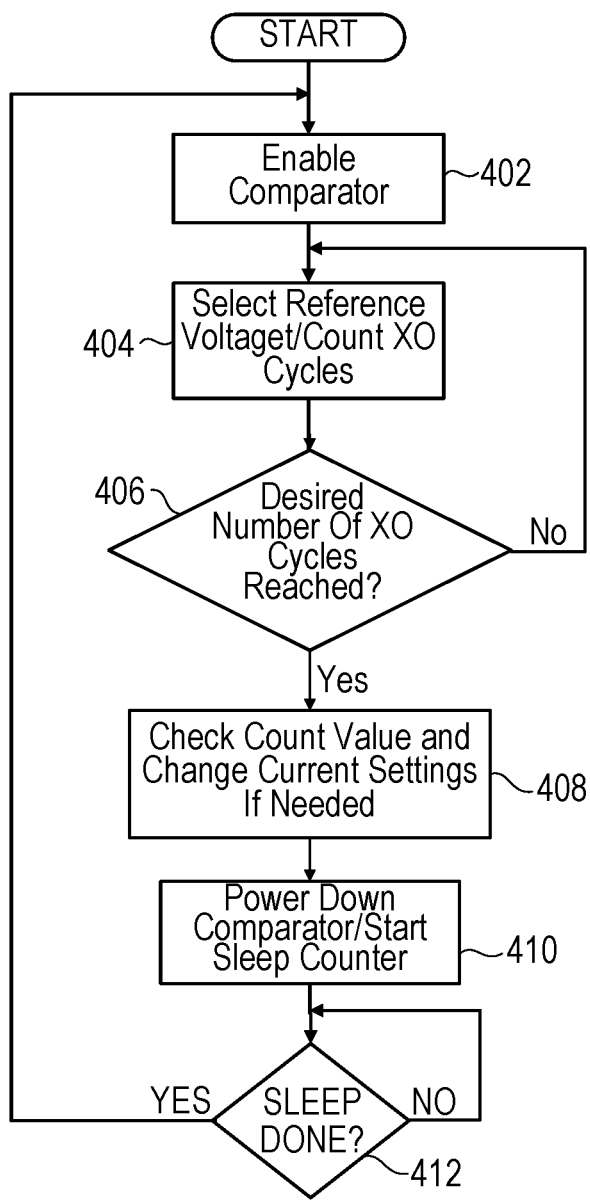
FIG. 4 illustrates the operation of the control logic to control the sleep state of the magnitude check circuit.

FIG. 4 illustrates the operation of the control logic to control the sleep state, which may be implemented, e.g., as a state machine, programmable logic, a programmed microcontroller, or any appropriate combination. In 402 the comparator is enabled. In 404 the reference voltage is selected and a counter counts the number of cycles for the wake state, e.g., 16 cycles. The reference voltage may be changed each cycle or half way through the 16 cycles or some other scheme to ensure that half the time the high reference voltage is compared to the XO output and half the time the low reference voltage is compared to the XO output. In 406 the control logic checks if the desired number of cycles has been reached, e.g., 16 cycles. If not, the system continues to count XO cycles and select the reference voltage as desired. Once the 16 cycles (or other desired number of cycles) have occurred the process goes from 406 to 408. The control logic checks the count value and takes appropriate action to raise, lower, or leave the current level unchanged. The process then proceeds to 410 where the control logic powers down the comparator and any other logic not required to be powered and starts the sleep counter. Note that the comparator is the largest consumer of power in the magnitude control block 209. During sleep, the control logic maintains control of the current source (e.g., which transistors are turned on) in accordance with the latest XO magnitude check to ensure that the crystal oscillator maintains the desired oscillation. Once the desired sleep length is reached in 412, the process returns to 402 to again enable the comparator, check the magnitude of the sine wave generated by the crystal and make any necessary adjustments.

In an embodiment, the crystal oscillator output is, e.g., an ~32 KHz clock signal, and is utilized to keep track of real time in a processor or other integrated circuit. The crystal oscillator clock can be used not only for sleep cycles for the comparator but also for other sleep events such as periodically waking up and communicating over a short range radio in Internet of Things (IoT) devices.

Figure 5:
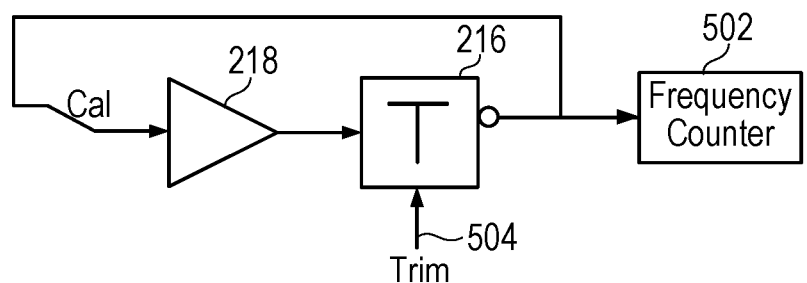
FIG. 5 shows the delay block configured in calibration mode.

Referring again to FIG. 2, in an embodiment the timing block 207 can be configured into calibration mode by connecting an inverted output of the delay block through the calibration path 228 to the squaring buffer 218. During crystal oscillator operation the normal path 229 is taken. FIG. 5 shows the delay block 207 configured in calibration mode. In calibration mode the resulting circuit self-resonates at a frequency tunable by tuning the delay in delay circuit 216. A frequency counter 502 can be used to determine the delay through delay block 216. The delay can be adjusted using the trim signal(s) 504. In an embodiment as explained further herein, the trim signal(s) control resistor values in the delay circuit 216. Note that the delay through the delay circuit is relatively stable over temperature in such an embodiment. The calibration can be performed during manufacturing using an external or internal frequency counter 502. In other embodiments, the calibration is performed after manufacturing, e.g., on power up or at any desired time using a frequency counter on chip. In other embodiments, the delay is adjusted using variable capacitors or a combination of variable capacitors and variable resistors. Many different delay circuit implementations are known in the art and the calibration details depend on the particular delay implementation.

Figure 6:
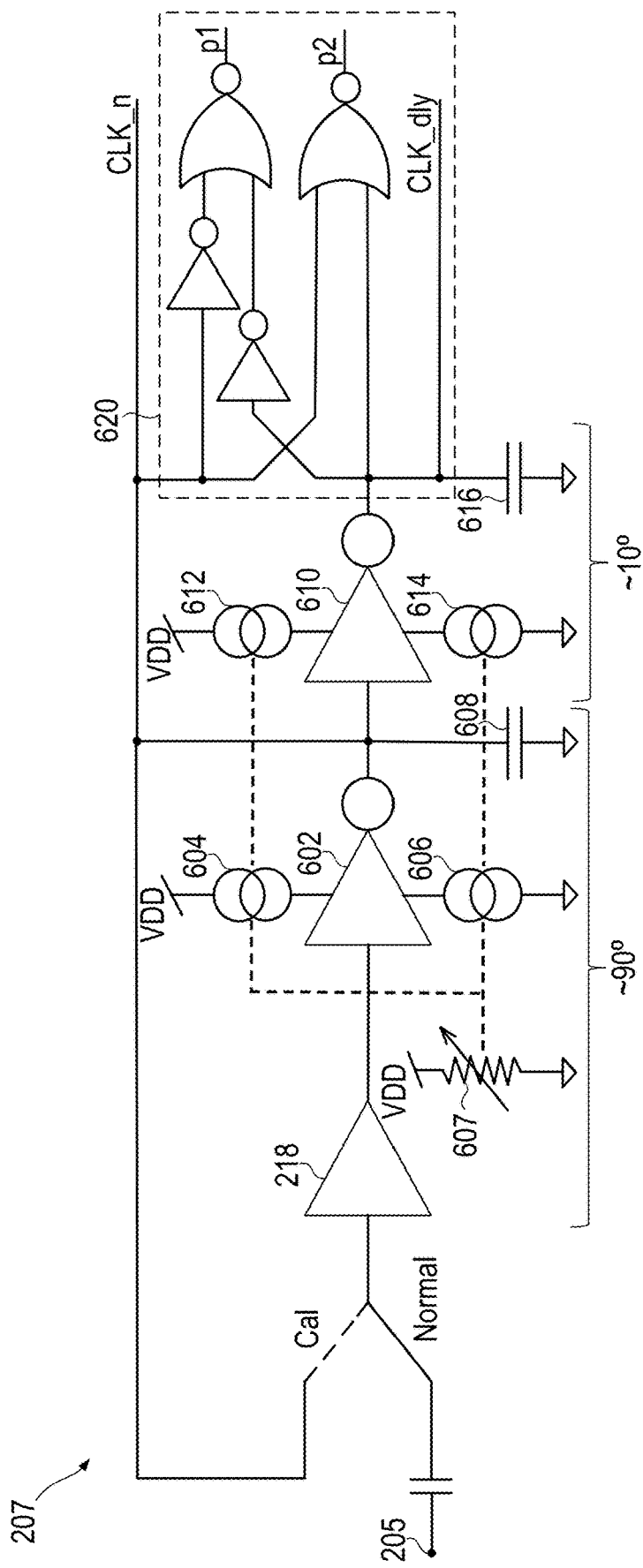
FIG. 6 illustrates an embodiment of the delay block.

FIG. 6 illustrates an embodiment of the delay block 207 and in particular an embodiment of the delay 216 implemented using a delay in which the capacitance (C) is fixed and the resistance (R) is variable. In addition, FIG. 6 shows the generation of the control signals for switches 208 and 210 shown in FIG. 2. The squaring buffer 218 receives the output of the crystal from node 205 (FIG. 2). The squaring buffer converts the sine wave to a square wave. Inverter 602 receives the output of the squaring buffer and has current control elements 604 and 606 in which the current is determined by the value of a voltage over the variable resistance 607. Capacitor 608 loads the output of the inverter 602. The combination of the squaring buffer 218, the first inverter 602, current control elements 604 and 606, and capacitor 608 generate a delay that is approximately 90° from the input to the squaring buffer. The clock signal CLK_n is fed back to the input of circuit 207 during calibration. CLK_n is supplied to an internal or external frequency counter during calibration as described earlier.

Figure 7:
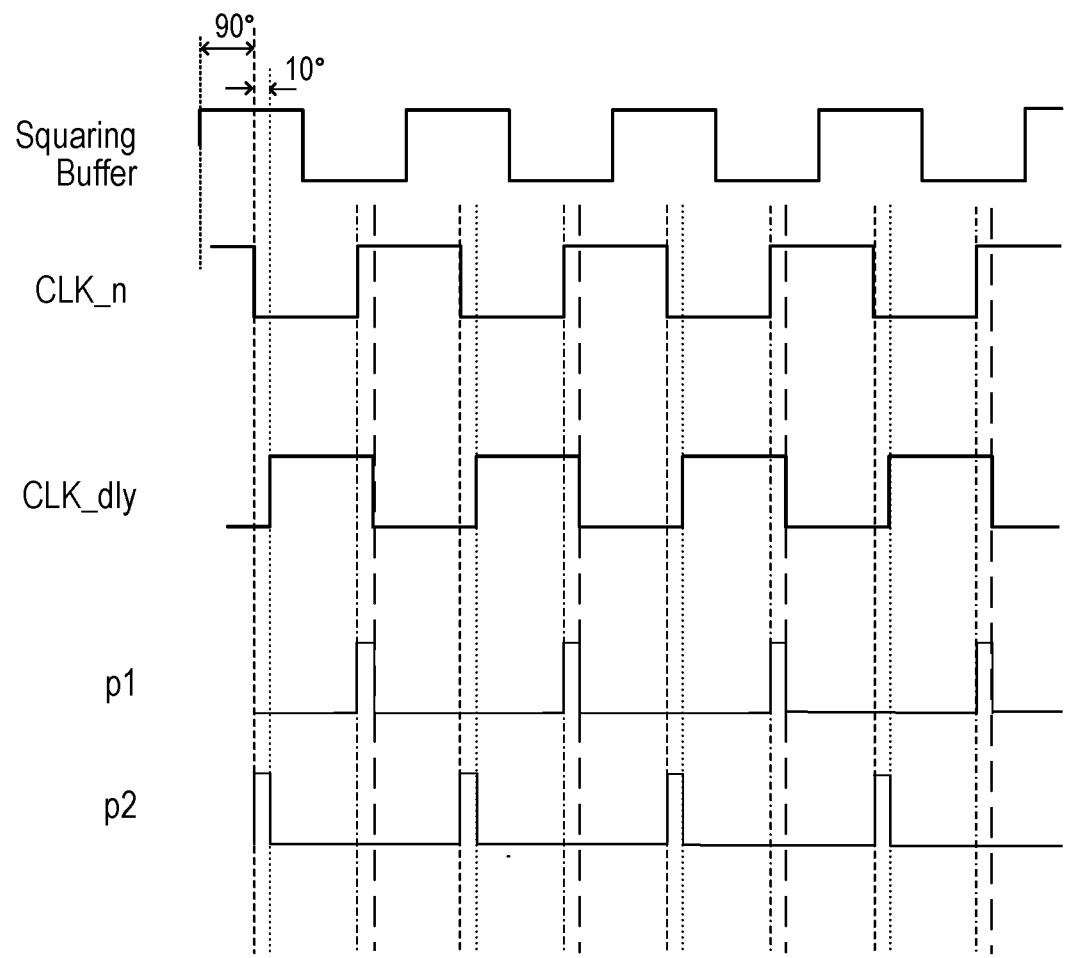
FIG. 7 illustrates a timing diagram of the generation of the switch signals by the embodiment shown in FIG. 6.

A second inverter 610 receives the output of inverter 602 and has current control elements 612 and 614 in which the current is determined by the value of the variable resistance. Capacitor 616 loads the output of the inverter 610. The second inverter adds another approximately 10° delay, which is used by logic 620 to generate pulses p1 and p2 used. Pulse p1 controls switch 306 (FIG. 3) and switch SW1 208 (FIG. 2) and pulse p2 controls switch SW2 210 (FIG. 2). Thus, p1 asserts high when the sine wave peaks at node 203 (FIG. 2) and p2 asserts high at the sine wave negative peak (trough) at node 203. The 10° delay helps create a pulse that starts at the CLK_n clock edge. Note that the exact duration of the pulses p1 and p2 should be enough to let the capacitor discharge to the crystal or node 203 discharge to ground for pulse p2. Thus, other embodiments use delays other than 10°, e.g., 5° to 20° to control the pulse width depending on the needed pulse width for the particular implementation. FIG. 7 is a timing diagram illustrating generation of the switch signals by the embodiment shown in FIG. 6. As can be seen in FIG. 7, the pulse p1 starts at the rising edge of CLK_n, which corresponds to the sine wave peak at node 203 and pulse p2 starts on the falling edge of CLK_n, which corresponds to the sine wave trough at node 203.

While FIG. 6 shows one way to delay the crystal output and the timing for the switch controls, one of ordinary skill would understand there are many ways to implement the required delays and switch controls. For example, the delay could conceivably be implemented with regular RC links, using another clock source, or an under-powered input stage. The calibration could be completed by measuring the delay directly, e.g., applying a signal and observing the input and output assuming the output was accessible.

Thus, a low power crystal oscillator has been described. The description of the invention set forth herein is illustrative and is not intended to limit the scope of the invention as set forth in the following claims. The terms "first," "second," "third," and so forth, as used in the claims, unless otherwise clear by context, is to distinguish between different items in the claims and do not otherwise indicate or imply any order in time, location, or quality. Variations and modifications of the embodiments disclosed herein may be made based on the description set forth herein, without departing from the scope of the invention as set forth in the following claims.

What is claimed is:

1. An apparatus comprising:
   a current source to supply a current;
   a capacitor coupled to be charged by the current;
   a first switch to couple the capacitor to a crystal and periodically inject a charge from the capacitor into a first node of the crystal;
   a timing circuit coupled to the crystal and configured to supply a delayed signal that is delayed from a zero crossing of an output of the crystal on a second node of the crystal, the delayed signal used to control timing of injecting the charge into the crystal; and
   wherein the timing circuit is configurable into a self-resonant mode for calibration by coupling an output of the timing circuit to an input of the timing circuit in place of the output of the crystal.

2. The apparatus as recited in claim 1 wherein the charge is injected into the crystal every cycle of a crystal oscillator that includes the crystal.

3. The apparatus as recited in claim 1 further comprising the crystal.

4. The apparatus as recited in claim 1
   wherein the charge injection starts at approximately a peak of a crystal oscillator signal on the first node of the crystal.

5. The apparatus as recited in claim 1 further wherein a delay in the timing circuit is calibrated in the self-resonant mode.

6. The apparatus as recited in claim 1 further comprising:
a comparator circuit to compare a magnitude of the output of the crystal to a reference voltage; and
a gain control circuit coupled to the comparator circuit to control the current source to adjust the current higher responsive to the magnitude of the output of the crystal being too low and to adjust the current lower responsive to the magnitude of the output of the crystal being too high.

7. The apparatus as recited in claim 6 wherein the comparator circuit is powered off to save power for a period of time, and periodically turned back on to compare the magnitude.

8. The apparatus as recited in claim 6 wherein the magnitude of the output of the crystal is too high if the magnitude of output of the crystal is above a high reference voltage a sufficient number of times over a time interval, the high reference voltage being supplied as the reference voltage.

9. The apparatus as recited in claim 6 wherein the magnitude of the output of the crystal is too low if the magnitude of the output of the crystal is below a low reference voltage a sufficient number of times over a time interval, the low reference voltage being supplied as the reference voltage.

10. A method comprising:
in an operational mode,
supplying current from a current source to charge a capacitor;
periodically injecting a charge from the capacitor into a crystal in a crystal oscillator;
generating in a timing circuit a switch signal to periodically control a switch to inject the charge by delaying assertion of the switch signal from a zero crossing of an output signal of the crystal oscillator;
comparing a magnitude of the output signal to one or more reference voltages in a comparator and generating a comparison result;
controlling the current source according to the comparison result; and
grounding an input of the comparator responsive to assertion of the switch signal.

11. The method as recited in claim 10 further comprising injecting the charge into the crystal every cycle of the crystal oscillator.

12. The method as recited in claim 11 further comprising injecting the charge at approximately a peak of a crystal oscillator signal on a node at which the charge is being injected.

13. The method as recited in claim 11 further comprising generating the switch signal by delaying assertion of the switch signal from the zero crossing by approximately 90 degrees.

14. The method as recited in claim 10 further comprising:
in a calibration mode,
configuring the timing circuit used to time injection of the charge into a self-resonant mode for calibration by coupling the switch signal to an input of the timing circuit in place of the output signal of the crystal.

15. The method as recited in claim 14 further calibrating a delay in the timing circuit in the self-resonant mode.

16. The method as recited in claim 10 further controlling the current source according to comparison of the magnitude.

17. The method as recited in claim 16 further comprising:
incrementing a count value responsive to the magnitude of the output signal of the crystal being above a high reference voltage and incrementing the count value responsive to the magnitude of the output signal of the crystal being above a low reference voltage; and
controlling the current source according to the count value.

18. A crystal oscillator comprising:
a current source to supply a current;
a capacitor coupled to be charged by the current and coupled to supply a charge that is periodically injected into a crystal of the crystal oscillator in an operational mode;
a first switch to couple the capacitor to the crystal;
a timing circuit configured to control the first switch to cause the charge to be injected beginning at approximately a peak of a crystal output signal on a first node of the crystal in the operational mode, an input of the timing circuit being coupled to an output signal of the crystal on a second node of the crystal in the operational mode;
wherein the timing circuit is configurable into a self-resonant mode by coupling an output of the timing circuit to the input of the timing circuit in place of the output signal of the crystal;
a comparator circuit to compare a magnitude of the output signal of the crystal on a second node of the crystal to a reference voltage and supply compare results in the operational mode; and
a gain control circuit coupled to the comparator circuit to control the current source to adjust the current being used to charge the capacitor to regulate the charge being injected into the crystal based on the compare results to thereby control the magnitude of the output signal of the crystal in the operational mode.

19. The crystal oscillator as recited in claim 18 wherein the timing circuit generates a first control signal and a second control signal and the first switch is responsive to assertion of the first control signal to cause the charge to be injected into the crystal on the first node of the crystal and the second control signal causes the first node of the crystal to be coupled to ground and in self resonant mode the first control signal is the output coupled to the input of the timing circuit.

20. The crystal oscillator as recited in claim 19 wherein a positive input of the comparator circuit is coupled to ground responsive to assertion of the first control signal.

* * * * *